(12) United States Patent
Ren

(10) Patent No.: US 9,899,233 B2
(45) Date of Patent: Feb. 20, 2018

(54) MANUFACTURING METHOD FOR REDUCING THE SURFACE ROUGHNESS OF A LOW TEMPERATUREPOLY-SILICON AND A LOW TEMPERATUREPOLY-SILICON THEREOF

(71) Applicant: Shenzhen China Star Optoelectronics Technology Co., Ltd., Shenzhen, Guangdong (CN)

(72) Inventor: Wei Ren, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 77 days.

(21) Appl. No.: 14/909,089

(22) PCT Filed: Dec. 25, 2015

(86) PCT No.: PCT/CN2015/098995
§ 371 (c)(1),
(2) Date: Jan. 29, 2016

(87) PCT Pub. No.: WO2017/071049
PCT Pub. Date: May 4, 2017

(65) Prior Publication Data
US 2017/0263468 A1    Sep. 14, 2017

(30) Foreign Application Priority Data

Oct. 30, 2015 (CN) .......................... 2015 1 0724613

(51) Int. Cl.
*H01L 21/20* (2006.01)
*H01L 21/3213* (2006.01)
(Continued)

(52) U.S. Cl.
CPC .. *H01L 21/32134* (2013.01); *G02F 1/136277* (2013.01); *H01L 21/268* (2013.01); *H01L 21/324* (2013.01); *G02F 2202/104* (2013.01)

(58) Field of Classification Search
CPC .................................................. H01L 21/2026
See application file for complete search history.

(56) References Cited

U.S. PATENT DOCUMENTS

| 5,817,550 A * | 10/1998 | Carey | H01L 21/268 257/E21.119 |
| 2003/0003616 A1* | 1/2003 | Ikuta | H01L 29/66765 438/30 |

(Continued)

FOREIGN PATENT DOCUMENTS

| CN | 1540719 A | 10/2004 |
| CN | 102651311 A | 8/2012 |
| CN | 104779139 A | 7/2015 |

*Primary Examiner* — Zandra Smith
*Assistant Examiner* — Andre' C Stevenson
(74) *Attorney, Agent, or Firm* — Andrew C. Cheng

(57) ABSTRACT

The present invention discloses a manufacturing method to reduce the surface roughness of the low temperature poly-silicon, including: a surface pretreatment is performed to a substrate with a a-Si layer on it, to form an oxidation layer on the a-Si layer. A first excimer laser annealing is performed on the substrate to make the a-Si layer into a poly-silicon layer; an acid liquid clean is used on the poly-silicon layer to remove the protrusions on the poly-silicon layer; a second excimer laser annealing is performed to the poly-silicon layer to obtain a low temperature poly-silicon layer with lower surface roughness. The manufacturing method is easy to operation and reduce the surface roughness of the low temperature poly-silicon layer with efficiency to obtain a low temperature poly-silicon layer with low roughness, uniform surface and well crystalliza- (Continued)

tion. A low temperature poly-silicon layer formed according to the present invention is also provided.

20 Claims, 2 Drawing Sheets

(51) Int. Cl.
*H01L 21/268* (2006.01)
*H01L 21/324* (2006.01)
*G02F 1/1362* (2006.01)

(56) References Cited

U.S. PATENT DOCUMENTS

2004/0157413 A1* 8/2004 Miyairi ................. G02F 1/1362
  438/479
2006/0240647 A1* 10/2006 Mitsuhashi ......... H01L 21/2026
  438/487
2008/0121892 A1 5/2008 Tseng et al.
2009/0283773 A1* 11/2009 Yasumatsu .......... H01L 21/3003
  257/72

* cited by examiner

MANUFACTURING METHOD FOR REDUCING THE SURFACE ROUGHNESS OF A LOW TEMPERATUREPOLY-SILICON AND A LOW TEMPERATUREPOLY-SILICON THEREOF

CROSS REFERENCE

This application claims the priority of Chinese Patent Application No. 201510724613.4, entitled "MANUFACTURING METHOD FOR REDUCING THE SURFACE ROUGHNESS OF A LOW TEMPERATURE POLY-SILICON AND A LOW TEMPERATURE POLY-SILICON THEREOF", filed on Oct. 30, 2015, the disclosure of which is incorporated herein by reference in its entirety.

FIELD OF THE INVENTION

The present invention relates to a liquid crystal display technology field, and more particularly to a manufacturing method for reducing the surface roughness of a low temperature poly-silicon and a low temperature poly-silicon thereof.

BACKGROUND OF THE INVENTION

In the manufacturing filed of the liquid crystal display technology, since the low temperature poly-silicon, LTPS technology has a better electron mobility, it becomes a new innovation direction of the liquid crystal display. The LTPS technology with the advantage of light, thin, low energy consumption, high brightness and high resolution becomes high-profile.

In the LTPS technology, an a-Si layer is usually formed by the chemical vapor deposition and a crystallization process is performed thereof. The crystallization process is usually performed by Excimer Laser Annealing, ELA technology. The Excimer Laser Annealing, ELA technology is usually melt the a-Si layer to an a-Si liquid by the high temperature of laser. When the a-Si liquid is cool down, the a-Si liquid will depend the crystal unclear in the interface of the solid phase and the liquid phase and a poly silicon, poly-silicon layer is grown.

A crystallization pretreatment to the a-Si layer is usually performed before the ELA crystallization. The pretreatment of the ELA crystallization is usually formed a surface oxidation layer to buffer the energy and form a poly-silicon layer with larger and uniform grain size. Therefore, many technical people focus on the optimization of the technology of the crystallization pretreatment of the ELA to obtain the uniform poly silicon layer.

However, since the difference of the density in the solid phase silicon and the liquid silicon and the stress function in the crystallization process is different. After the crystallization pretreatment of the ELA, even the uniform surface oxidation layer is formed, there are much protrusions in the surface of the interface in the final formed poly-silicon layer as illustrated in FIG. 1, and the later poly-silicon process is influenced. Therefore, a new method to reduce the surface roughness of the low temperature poly-silicon is provided.

SUMMARY OF THE INVENTION

Therefore, a manufacturing method to reduce the surface roughness of the low temperature poly-silicon is provided of the present invention, the manufacturing method including performing the excimer laser annealing treatment twice and the a-Si layer clean pretreatment before the first excimer laser annealing crystallization treatment, the poly-silicon layer clean pretreatment before the second excimer laser annealing crystallization treatment to obtain the lower surface roughness and uniform poly-silicon layer.

In the first aspect, a manufacturing method to reduce the surface roughness of the low temperature poly-silicon is provided including the following step:

(1) a substrate with the a-Si layer grown on it is provided, a surface pretreatment is performed in the surface and a uniform oxidation layer is formed on the a-Si layer;

(2) a first excimer laser annealing treatment is performed on the substrate after the surface pretreatment to make the a-Si layer into a poly-silicon layer;

(3) an acid liquid of HF solution is used to clean the poly-silicon layer to remove the protrusions on the poly-silicon layer;

(4) a second excimer laser annealing treatment is performed to the poly-silicon layer to obtain a low temperature poly-silicon layer.

Selectively, in the step 1, the substrate includes one of glass substrate, plastic substrate, ceramic substrate and graphite.

Selectively, a buffer layer is formed between the substrate and the a-Si layer.

Selectively, the buffer layer is deposited by SiN, and $SiO_2$ sequentially.

The a-Si layer will be oxidation in the nature environment, and a $SiO_2$ layer will be formed on the surface. The uniformity and the quality of the oxidation layer is not good, and the surface oxidation layer have the function of energy buffer in the following excimer laser annealing crystallization treatment. The non-uniformity will influence the result of the excimer laser annealing crystallization and uniformity of the poly-silicon. Therefore, the surface pretreatment of the a-Si layer is needed for the manufacturing of the poly-silicon with high uniformity to form a uniform oxidation layer.

Selectively, in the step (1), the surface pretreatment of the a-Si layer further includes using a HF solution and a ozone water to clean the substrate subsequently. The HF solution is adapted to etch the substrate and remove the no uniform nature oxidation layer and the glitch, and form a uniform oxidation layer with good quality on the surface of the a-Si layer by the treatment of the ozone water.

In order to avoid the influence of the solution remain on the surface of the substrate. Selectively, water is used to clean the substrate after the clean of the HF solution. And the substrate is clean by the ozone water after the step of drying. The pure eater, $H_2$ water (pure water having 1 ppm $H_2$) or high pressure water is used to clean the substrate.

Selectively, the concentration of the HF solution is 0.5-2% and the clean time of the HF solution is 20-40 secs.

Selectively, the concentration of the HF solution is 1% and the clean time of the HF solution is 30 secs.

Selectively, the concentration of the ozone water is 15-25 ppm and the clean time of the HF solution is 40-70 secs.

Selectively, the concentration of the ozone water is 15-25 ppm and the clean time of the HF solution is 60 secs.

As mentioned in the present invention, the oxidation layer formed by the surface pretreatment is $SiO_2$ layer, the $SiO_2$ layer can preserve heat and prevent the loss of the heat energy, during the process of the excimer laser annealing treatment.

Selectively, the thickness of the oxidation layer in step (1) is 3-5 nm.

When a shot of laser irradiation on the a-Si layer, and when the temperature of the surface reaches the melting point such as the crystallization threshold energy density, the leading edge of the surface melting of the a-Si layer will be deep into a-Si interior. The irradiation temperature of the a-Si layer is low in the intermediate and high on both sides. The crystal nuclei are formed in the border. After the laser irradiation is stop, the molten layer is cool down from both sides, the interface between solid and liquid phases will be moved to the middle and the surface, and the natural nucleus will be formed in the intermediate subsequently. After cooling, the amorphous silicon transformed into poly-silicon crystal p-Si, crystals are formed by the boundary of the natural nuclei, p-Si layer is composed of many small crystalline particles of Si atoms (referred to as grain) combination, the boundary of grains called grain boundaries.

The larger the exposure intensity of the laser (or the energy density), the grain size is bigger, the mobility of the p-Si is larger. But the energy cannot be too high, the mobility will decrease by the high energy.

Selectively, the wavelength used in the excimer laser annealing treatment in step (2) and step (4) is 308 nm.

Selectively, the energy density used in the first excimer laser annealing treatment in step (2) is 440-465 W/cm$^2$. The first excimer laser annealing treatment is adapted to the substrate after the surface pretreatment.

The energy density of the laser is also related to the thickness of the surface oxidation layer. when the less thickness of the oxidation layer, the more ability of the $SiO_2$ layer to digest the heat energy and the larger energy density is needed. When the more thickness of the oxidation layer, the less ability of the $SiO_2$ layer to digest the heat energy and the less energy density is needed. In the specific embodiment, the energy of the ELA can be adjusted by the thickness of the oxidation layer after the surface pretreatment.

Selectively, the concentration of the HF solution used in step (3) is 0.5-2% and the clean time of the HF solution is 20-40 secs.

Selectively, the concentration of the HF solution used in step (3) is 1% and the clean time of the HF solution is 30 secs.

Selectively, the energy density used in the second excimer laser annealing treatment in step (4) is 350-440 W/cm$^2$.

Selectively, the grain size of the low-temp poly-silicon in step (4) is 3600-4000 Å, and the surface roughness is 1-2 nm.

In the manufacturing method to reduce the surface roughness of the low temperature poly-silicon according to the present invention, the first ELA crystallization process is mainly to make the a-Si into p-Si crystals, and such that the grain size of the p-Si meets the required. The normal ELA crystallization process, since the instant laser act on the a-Si, a-Si is melting in the high temperature and becomes p-Si, the difference of the different densities and the corresponding interface stresses between the a-Si and the p-Si, some crystal will be pushed onto the surface of the poly-silicon layer, and become protrusions during the p-Si crystal nucleating in the crystallization process. By the second time using HF cleaning action and a second low-energy ELA crystallization process, the protrusion can be treated by the HF solution, to reduce the surface roughness and the damage to the poly-silicon during the clean step can be reduced by the second ELA to obtain a complete crystallization poly-silicon, the surface roughness and further decreased the grain size to achieve the desired requirements. The manufacturing method is simple and easy to operate, can effectively reduce the surface roughness of the poly-silicon obtain low roughness, surface uniformity and good performance of low temperature poly-silicon crystallization.

In the second aspect, a low temperature poly-silicon is obtained by the manufacturing method of the first aspect.

the grain size of the low-temp poly-silicon is 3600-4000 Å, and the surface roughness is 1-2 nm. The surface roughness is the height of the protrusions in the surface of the poly-silicon.

The advantage of the present invention:

The manufacturing method to reduce the surface roughness of the low temperature poly-silicon according to the present invention, the method includes two excimer laser annealing treatment, a clean pretreatment of the a-Si layer before the first excimer laser annealing treatment, a clean pretreatment of the poly-silicon layer before the second excimer laser annealing treatment. The manufacturing method is easy to operation and reduce the surface roughness of the low temperature poly-silicon layer with efficiency to obtain a low temperature poly-silicon layer with low roughness, uniform surface and well crystallization. The low temperature poly-silicon layer has great ability and can be used in the display filed with high resolution.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

First Embodiment

Figure 1:
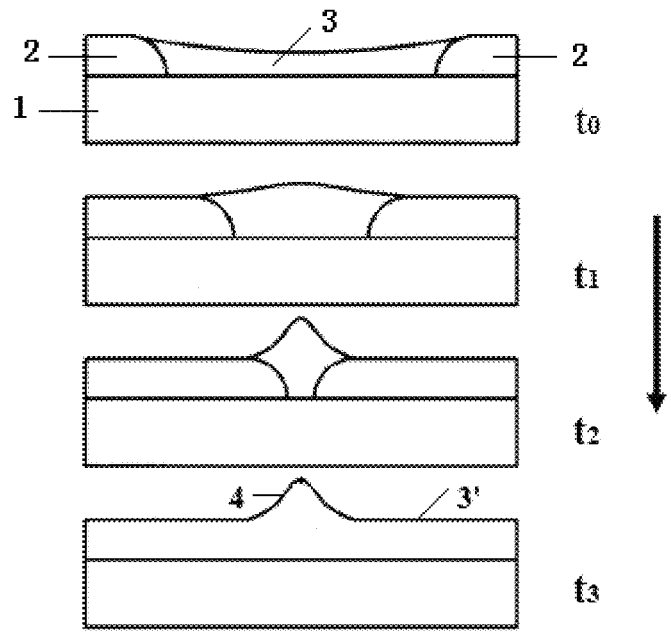
FIG. 1 illustrated the manufacturing process of forming a poly-silicon in the conventional technology. 1: substrate, 2: solid silicon, 3: liquid silicon, 3': poly silicon, 4: the protrusions in the crystal interface surface of 3'.
Figure 2:
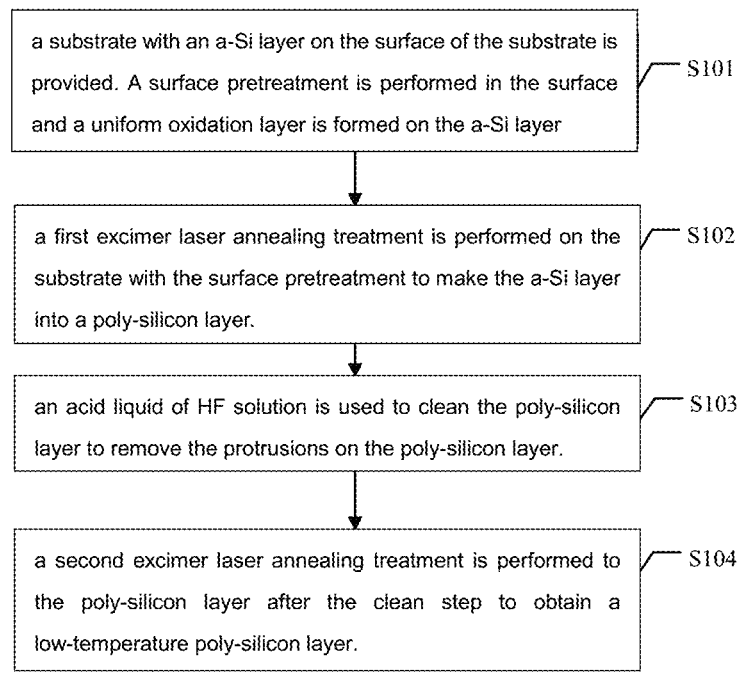
FIG. 2 is a manufacturing process flow according to the method to reduce the surface roughness of the low temperature poly-silicon of the present invention.

FIG. 2 illustrates a manufacturing process flow showing the method to reduce the surface roughness of the low temperature poly-silicon of the present invention. The manufacturing process of the method to reduce the surface roughness of the low temperature poly-silicon in the embodiment including the following steps:

S101 step: a substrate with an a-Si layer on the surface of the substrate is provided. A surface pretreatment is performed in the surface and a uniform oxidation layer is formed on the a-Si layer.

In this embodiment, glass is chosen as a substrate. An a-Si layer with 45 nm thickness is formed by the chemical vapor deposition on the glass substrate. A buffer layer is further formed in the glass substrate before the said process, and the a-Si layer is formed on the buffer layer. The buffer layer and the a-Si layer can be formed by the conventional technology. In this embodiment, the buffer layer is deposited by SiN and $SiO_2$ sequentially.

In this embodiment, the surface pretreatment is cleaning the substrate by HF with the concentration of 1% in 30 secs. Then, after cleaning the substrate by water, a clean N2 is used to dry the substrate; then an ozone water is further used to clean the substrate with the concentration of 20 ppm in 60 secs. Then, after cleaning the substrate by water, a clean N2 is used to dry the substrate to form a uniform $SiO_2$ oxidation layer with the thickness of 4 nm.

S102 step: a first excimer laser annealing treatment is performed on the substrate with the surface pretreatment to make the a-Si layer into a poly-silicon layer.

In this embodiment, the excimer laser annealing equipment by JSW is performed in a room temperature and in normal atmospheric pressure. The excimer laser with the 308 nm wavelength, 25 μm scanning pitch and 440 $W/cm^2$ energy density is used on the substrate with the surface pretreatment to make the a-Si layer into a poly-silicon layer.

S103 step: an acid liquid of HF solution is used to clean the poly-silicon layer to remove the protrusions on the poly-silicon layer.

In this embodiment, the HF solution is with the concentration of 1% in 30 secs.

S104 step: a second excimer laser annealing treatment is performed to the poly-silicon layer after the clean step to obtain a low temperature poly-silicon layer.

In this embodiment, the excimer laser annealing equipment by JSW is performed in a room temperature and in normal atmospheric pressure. The excimer laser with the 308 nm wavelength, 25 μm scanning pitch and 400 $W/cm^2$ energy density is used on the poly-silicon layer after the clean step to obtain a low temperature poly-silicon layer with lower surface roughness.

Comparing Embodiment 1

In order to show the advantage of the embodiment in this application, the conventional technology is used to the pretreatment of the surface of the a-Si layer and the excimer laser annealing process. The detail process is the same of the step S101-S102 in the first embodiment.

Figure 3:
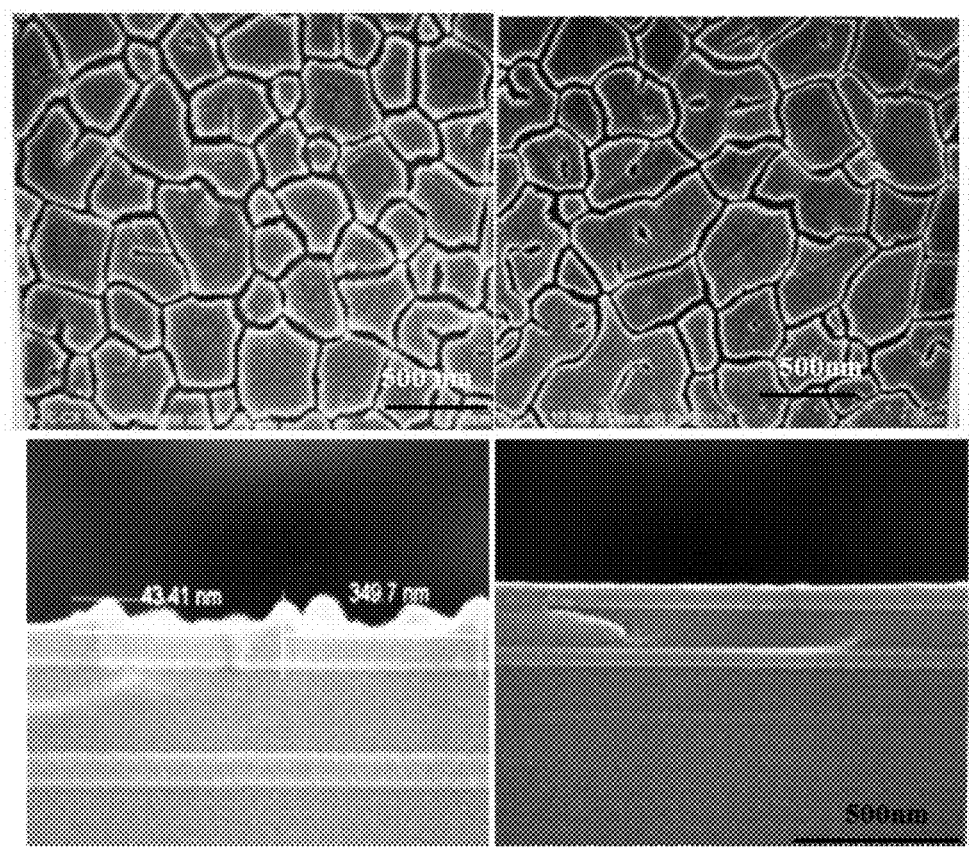
FIG. 3 illustrates the difference of the SEM pictures of the poly silicon according to the first embodiment of the present invention and the conventional technology. The first column of the FIG. 3 illustrates the poly silicon formed by the conventional technology compared to the first embodiment, and the second column of the FIG. 3 illustrates the poly silicon formed according to the first embodiment of the present invention.

The surface roughness, grain size of the low temperature poly silicon layer of the first embodiment and the comparing embodiment 1 is compared by the SEM pictures, and illustrated in FIG. 3.

By comparing the first embodiment and the comparing embodiment 1, as illustrated in FIG. 3. The low temperature poly-silicon according to the first embodiment of the present invention illustrated in the second column of the FIG. 3, the grain size is uniform, and the diameter is 380 nm, the surface is smooth and without protrusions, and the surface roughness is 1-2 nm; comparing to the comparing embodiment 1 as illustrated in the first column of the FIG. 3, the surface is rough, and have a plurality of continuous protrusions, the high of the protrusions (surface roughness) is 43 nm. Therefore, as we can know, the poly silicon has high surface roughness with one excimer laser annealing process, and it must influence poly silicon layer in the following film-making process and hard to obtain the uniform threshold voltage and current characteristic and to influence the applying of the poly silicon in the high quality display. By the comparing of the first embodiment, and the comparing embodiment 1, the manufacturing method in this present invention can reduce the surface roughness of the poly-silicon, and obtain a low roughness, smooth and with high crystallization surface.

Second Embodiment

The steps to a manufacturing method to reduce the surface roughness of the low temperature poly-silicon is as followed:

Step (1). a ceramic substrate with an 43 nm a-Si layer on the surface of the substrate is provided. A surface pretreatment is performed in the ceramic surface and a uniform oxidation layer is formed on the a-Si layer. The surface pretreatment includes, cleaning the substrate by HF solution with the concentration of 1% in 70 secs. Then, after cleaning the substrate by water, a clean N2 is used to dry the substrate; then an ozone water is further used to clean the substrate with the concentration of 15 ppm in 70 secs. Then, after cleaning the substrate by water, a clean N2 is used to dry the substrate to form a uniform $SiO_2$ oxidation layer with the thickness of 3 nm.

Step (2). a first excimer laser annealing treatment is performed on the substrate with the surface pretreatment to make the a-Si layer into a poly-silicon layer. The energy density of the excimer laser is 450 $W/cm^2$.

Step (3). an acid liquid of HF solution with the concentration of 0.5% is used to clean the poly-silicon layer in 40 secs to remove the protrusions on the poly-silicon layer.

Step (4). a second excimer laser annealing treatment is performed to the poly-silicon layer after the clean step to obtain a low temperature poly-silicon layer. The energy density of the excimer laser is 350 $W/cm^2$.

Comparing to the poly silicon layer in step (2), the surface roughness in step (4) is highly reduced.

Third Embodiment

The steps to a manufacturing method to reduce the surface roughness of the low temperature poly-silicon is as followed:

Step (1). a ceramic substrate with a 47 nm a-Si layer on the surface of the substrate is provided. A surface pretreatment is performed in the ceramic surface and a uniform oxidation layer is formed on the a-Si layer. The surface pretreatment includes, cleaning the substrate by HF solution with the concentration of 2% in 40 secs. Then, after cleaning the substrate by water, a clean N2 is used to dry the substrate; then an ozone water is further used to clean the substrate with the concentration of 25 ppm in 40 secs. Then, after cleaning the substrate by water, a clean N2 is used to dry the substrate to form a uniform $SiO_2$ oxidation layer with the thickness of 5 nm.

Step (2). a first excimer laser annealing treatment is performed on the substrate with the surface pretreatment to make the a-Si layer into a poly-silicon layer. The energy density of the excimer laser is 465 W/cm$^2$.

Step (3). an acid liquid of HF solution with the concentration of 2% is used to clean the poly-silicon layer in 20 secs to remove the protrusions on the poly-silicon layer.

Step (4). a second excimer laser annealing treatment is performed to the poly-silicon layer after the clean step to obtain a low temperature poly-silicon layer. The energy density of the excimer laser is 440 W/cm$^2$.

Comparing to the poly silicon layer in step (2), the surface roughness in step (4) is highly reduced.

Above are embodiments of the present invention, which does not limit the scope of the present invention. Any modifications, equivalent replacements or improvements within the spirit and principles of the embodiment described above should be covered by the protected scope of the invention.

What is claimed is:

1. A manufacturing method to reduce the surface roughness of the low temperature poly-silicon comprising the following step to be performed sequentially:
   first step: a substrate with a a-Si layer grown on it is provided, a surface pretreatment is performed in the surface and a uniform oxidation layer is formed on the a-Si layer;
   second step: a first excimer laser annealing treatment is performed on the substrate after the surface pretreatment to make the a-Si layer into a poly-silicon layer;
   third step: an acid liquid of HF solution is used to clean the poly-silicon layer to remove the protrusions on the poly-silicon layer;
   fourth step: a second excimer laser annealing treatment is performed to the poly-silicon layer to obtain a low temperature poly-silicon layer.

2. The manufacturing method to reduce the surface roughness of the low temperature poly-silicon according to claim 1, wherein the wavelengths used in the excimer laser annealing treatment in the second step and the fourth step are 308 nm.

3. The manufacturing method to reduce the surface roughness of the low temperature poly-silicon according to claim 1, wherein the energy density used in the second excimer laser annealing treatment in the fourth step is 350-440 W/cm$^2$.

4. The manufacturing method to reduce the surface roughness of the low temperature poly-silicon according to claim 1, wherein the energy density used in the first excimer laser annealing treatment in the second step is 440-465 W/cm$^2$.

5. The manufacturing method to reduce the surface roughness of the low temperature poly-silicon according to claim 1, wherein the concentration of the HF solution used in the third step is 0.5-2% and the clean time of the HF solution is 20-40 secs.

6. The manufacturing method to reduce the surface roughness of the low temperature poly-silicon according to claim 2, wherein the concentration of the HF solution used in the third step is 0.5-2% and the clean time of the HF solution is 20-40 secs.

7. The manufacturing method to reduce the surface roughness of the low temperature poly-silicon according to claim 3, wherein the concentration of the HF solution used in the third step is 0.5-2% and the clean time of the HF solution is 20-40 secs.

8. The manufacturing method to reduce the surface roughness of the low temperature poly-silicon according to claim 4, wherein the concentration of the HF solution used in the third step is 0.5-2% and the clean time of the HF solution is 20-40 secs.

9. The manufacturing method to reduce the surface roughness of the low temperature poly-silicon according to claim 1, wherein surface pretreatment in the first step further comprising using a HF solution and anozone water to clean the substrate subsequently.

10. The manufacturing method to reduce the surface roughness of the low temperature poly-silicon according to claim 9, wherein the concentration of the HF solution is 0.5-2% and the clean time of the HF solution is 20-40 secs.

11. The manufacturing method to reduce the surface roughness of the low temperature poly-silicon according to claim 9, wherein the concentration of the ozone water is 15-25 ppm and the clean time of the HF solution is 40-70 secs.

12. The manufacturing method to reduce the surface roughness of the low temperature poly-silicon according to claim 1, further comprising forming a buffer layer between the substrate and the a-Si layer in the first step, and the buffer layer is deposited by SiN, and $SiO_2$ sequentially.

13. The manufacturing method to reduce the surface roughness of the low temperature poly-silicon according to claim 1, further comprising to obtain a low temperature poly-silicon.

14. The manufacturing method to reduce the surface roughness of the low temperature poly-silicon according to claim 2, further comprising to obtain a low temperature poly-silicon.

15. The manufacturing method to reduce the surface roughness of the low temperature poly-silicon according to claim 3, further comprising to obtain a low temperature poly-silicon.

16. The manufacturing method to reduce the surface roughness of the low temperature poly-silicon according to claim 4, further comprising to obtain a low temperature poly-silicon.

17. The manufacturing method to reduce the surface roughness of the low temperature poly-silicon according to claim 5, further comprising to obtain a low temperature poly-silicon.

18. The manufacturing method to reduce the surface roughness of the low temperature poly-silicon according to claim 9, further comprising to obtain a low temperature poly-silicon.

19. The manufacturing method to reduce the surface roughness of the low temperature poly-silicon according to claim 11, further comprising to obtain a low temperature poly-silicon.

20. The manufacturing method to reduce the surface roughness of the low temperature poly-silicon according to claim 12, further comprising to obtain a low temperature poly-silicon.

* * * * *